(12) United States Patent
Ahn et al.

(10) Patent No.: US 9,106,198 B2
(45) Date of Patent: Aug. 11, 2015

(54) HIGH POWER TUNABLE CAPACITOR

(75) Inventors: Minsik Ahn, San Diego, CA (US); Kyu Hwan An, San Diego, CA (US); Chang-Ho Lee, San Diego, CA (US); Aristotele Hadjichristos, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 460 days.

(21) Appl. No.: 13/593,201

(22) Filed: Aug. 23, 2012

(65) Prior Publication Data

US 2014/0055212 A1   Feb. 27, 2014

(51) Int. Cl.
*H03H 7/01* (2006.01)
*H03H 7/48* (2006.01)
*H03K 17/56* (2006.01)

(52) U.S. Cl.
CPC .............. *H03H 7/0153* (2013.01); *H03H 7/01* (2013.01); *H03H 7/48* (2013.01); *H03K 17/56* (2013.01); *H03F 2200/378* (2013.01); *H03F 2200/387* (2013.01)

(58) Field of Classification Search
CPC ............................... H03H 7/0153; H03H 7/01
USPC ................................................. 333/172, 174
See application file for complete search history.

(56) References Cited

U.S. PATENT DOCUMENTS

| | | | |
|---|---|---|---|
| 7,123,898 | B2 | 10/2006 | Burgener et al. |
| 7,960,772 | B2 | 6/2011 | Englekirk |
| 2008/0079653 | A1* | 4/2008 | Ahn et al. ............... 343/904 |
| 2008/0272824 | A1 | 11/2008 | Fu |
| 2011/0002080 | A1 | 1/2011 | Ranta |
| 2011/0127849 | A1 | 6/2011 | Yoon et al. |
| 2011/0260773 | A1 | 10/2011 | Granger-Jones |
| 2011/0260780 | A1 | 10/2011 | Granger-Jones et al. |
| 2013/0029614 | A1* | 1/2013 | Cho et al. ............... 455/83 |

FOREIGN PATENT DOCUMENTS

WO    2012079038    6/2012

OTHER PUBLICATIONS

Francesco Carrara, Calogero D. Presti, Fausto Pappalardo, and Giuseppe Palmisano "A 2.4-GHz 24-dBm SOI CMOS Power Amplifier with Fully Integrated Output Balun and Switched Capacitors for Load Line Adaptation" University of Catania, Italy and UC San Diego, 2009.*
Huang Y-Y., et al., "Highly Linear RF CMOS Variable Attenuators with Adaptive Body Biasing", IEEE Journal of Solid-State Circuits, IEEE Service Center, Piscataway, NJ, USA, vol. 46, No. 5, May 1, 2011, pp. 1023-1033, XP011479221, ISSN: 0018-9200, DOI: 10.1109/JSSC.2011.2117530 abstract figures 18,19 V. Attenuator Implementation and Measurements.
International Search Report and Written Opinion—PCT/US2013/056056—ISA/EPO—Oct. 25, 2013.

* cited by examiner

*Primary Examiner* — Stephen E Jones
(74) *Attorney, Agent, or Firm* — Ramin Mobarhan

(57) ABSTRACT

A high power tunable capacitor is disclosed. In an exemplary embodiment, an apparatus includes a capacitor coupled to an input signal, a body contacted switch coupled to the capacitor, the body contacted switch coupled to a body bias signal, and a floating body switch coupled between the body contacted switch and a ground, the floating body switch configured to decouple the body bias signal from the ground.

19 Claims, 4 Drawing Sheets

HIGH POWER TUNABLE CAPACITOR

BACKGROUND

1. Field

The present application relates generally to the operation and design of electronic circuits, and more particularly, to the operation and design of tunable circuits.

2. Background

Conventional high power tunable capacitors comprise shunt switches configured as body contacted type switches where the body of the switch is controlled by a negative bias supply. When RF power amplifiers are integrated with these switches in the same package or on the same die, the RF ground can experience unexpected noise levels. These noise levels partially turn on the junction diode in the body contacted switches, which affects the negative bias supply distributed to all the switches thereby degrading performance of the capacitor.

Accordingly, a high power tunable capacitor is provided that is configured to isolate ground noise thereby improving performance.

BRIEF DESCRIPTION OF THE DRAWINGS

The foregoing aspects described herein will become more readily apparent by reference to the following description when taken in conjunction with the accompanying drawings wherein.

DETAILED DESCRIPTION

The detailed description set forth below in connection with the appended drawings is intended as a description of exemplary embodiments of the invention and is not intended to represent the only embodiments in which the invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
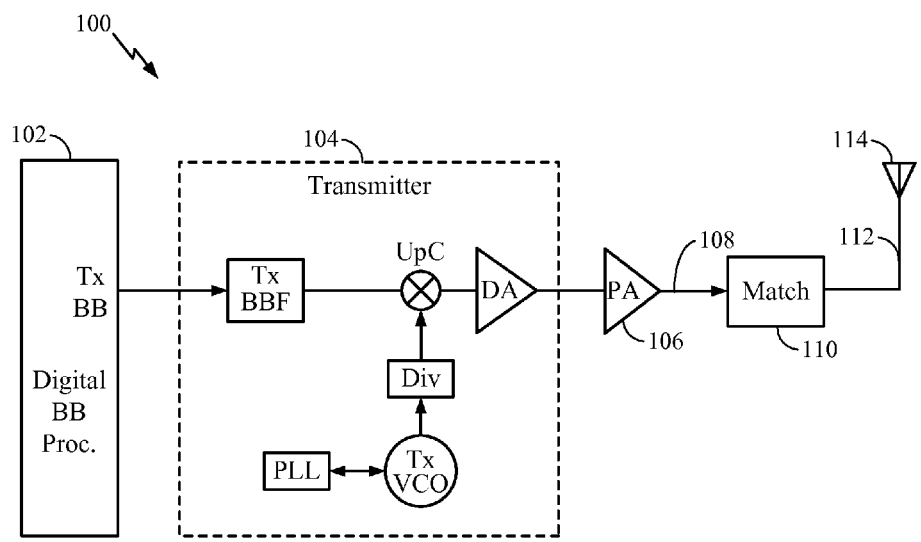
FIG. 1 shows a conventional front end for use in a wireless device.
Figure 2:
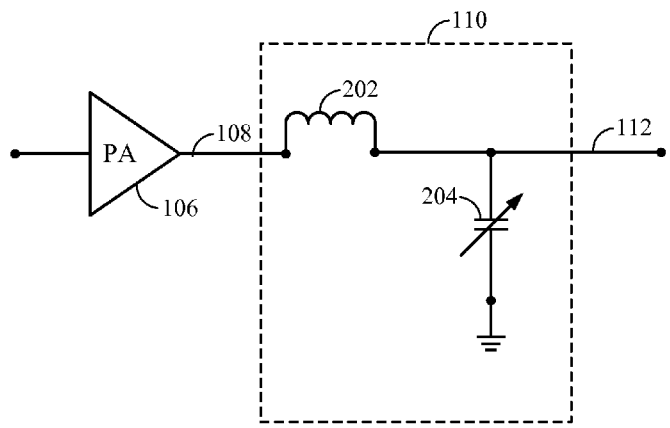
FIG. 2 shows a conventional matching circuit for use in the front end shown in FIG. 1.

FIG. 1 shows a conventional front end 100 for use in a wireless device. For example, the front end 100 is suitable for use in a cellular telephone. The front end 100 comprises a baseband (BB) processor 102 that outputs a BB transmit signal (Tx BB) to a transmitter 104. The transmitter 104 up-converts the Tx BB signal to generate an RF signal that is input to power amplifier 106. The power amplifier 106 amplifies the RF signal to generate a high power transmit signal 108 that is input to a matching circuit 110. The matching circuit 110 is configured to generate a high power matched signal 112 that is matched to an antenna 114, which transmits the high power matched signal. Thus, the matching circuit 110 should be capable of handling high power RF signals without degradation FIG. 2 shows a detailed embodiment of the conventional matching circuit 110 shown in FIG. 1. The matching circuit 110 comprises an inductor 202 coupled to a tunable capacitor 204. The inductor 202 and tunable capacitor 204 are configured to handle high power RF signals. The matching circuit 110 is adjusted by varying the capacitance of the tunable capacitor 204. In one implementation, the BB processor 102 is configured to output a control signal (not shown) that adjusts the capacitance value of the tunable capacitor 204.

Figure 3:
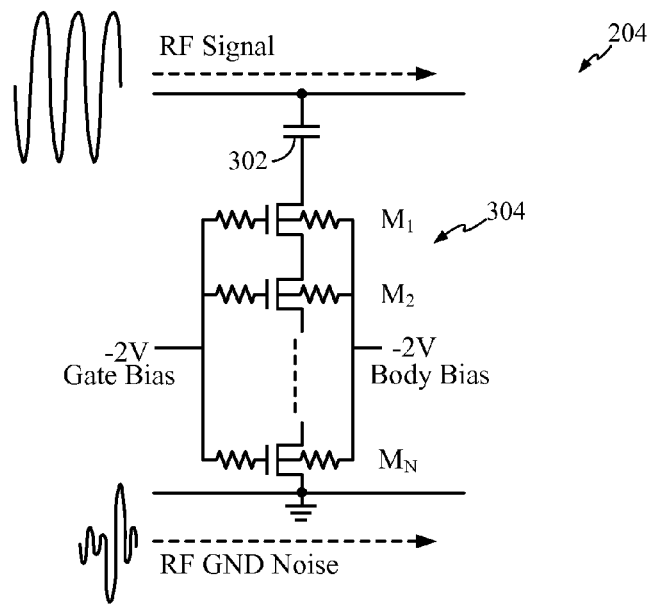
FIG. 3 shows a conventional tunable capacitor for use in the conventional matching circuit shown in FIG. 2.

FIG. 3 shows a detailed view of the conventional high power tunable capacitor 204. The tunable capacitor 204 comprises a metal-insulator-metal (MiM) capacitor 302 that provides a fixed capacitance value and a switch stack 304 comprising (N) switches (M) that selectively couple the capacitor 302 to an RF ground. In one implementation, the capacitor 302 provides a fixed capacitance value of approximately 1 pf. The switch stack 304 comprises a plurality of body contacted switches ($M_1$-$M_N$) and provides additional capacitance of approximately 0.1 pf. The capacitor 302 and switch stack 304 combine to form a switchable capacitor branch, and typically a plurality of the switchable capacitor branches are utilized to form the tunable capacitor 204.

The body contacted switches ($M_1$-$M_N$) of the switch stack 304 are coupled to a gate bias signal (i.e., −2V) and a body bias signal (i.e., −2V). As discussed in detail below, the conventional tunable capacitor 204 allows noise on the ground to alter the body bias signal thereby degrading capacitor performance.

Figure 4:
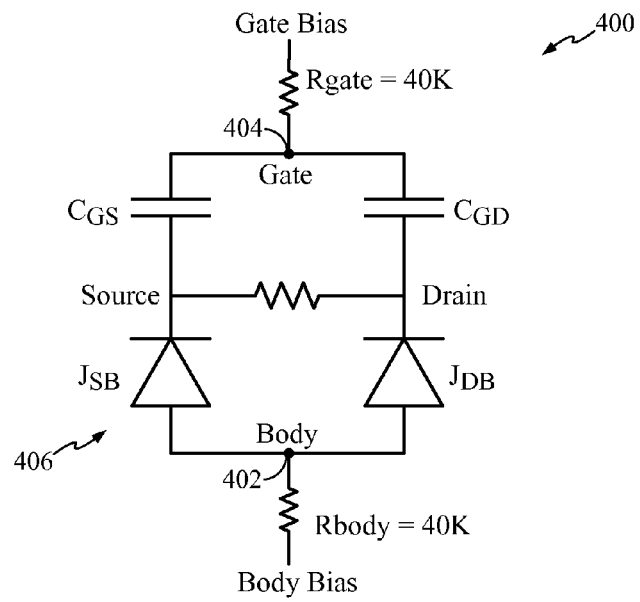
FIG. 4 shows a conventional body contacted FET switch for use in the convention tunable capacitor shown in FIG. 3.

FIG. 4 shows a conventional body contacted FET switch 400 for use in the conventional tunable capacitor shown in FIG. 3. For example, the switch 400 is suitable for use as any of the switches (M) shown in FIG. 3.

A body terminal 402 of the switch is biased with a body bias (Bb) signal that comprises a first negative bias supply (i.e., −2V). A gate terminal 404 of the switch 400 is biased by a gate bias (Gb) signal comprising a second negative bias supply (i.e., −2V). Unfortunately, when power amplifiers are integrated with body contacted switches in the same package or the same die, it is possible that the RF ground can experience unexpected noise levels. When the RF ground is impacted by RF noise, the junction diodes 406 of the switches in the switch stack 304 (i.e., switch $M_N$ shown in FIG. 3) can partially turn on. Current from the partially turned on junction diode 406 can change not only the negative body bias (Bb) at the body of the switch ($M_N$) coupled closest to the RF ground, but also the negative body bias (Bb) signal at all the other switches (M) in the switch stack 304. This in turn prevents the tunable capacitor 204 from having a stable negative body bias (Bb) signal, which results in degraded capacitor performance.

Figure 5:
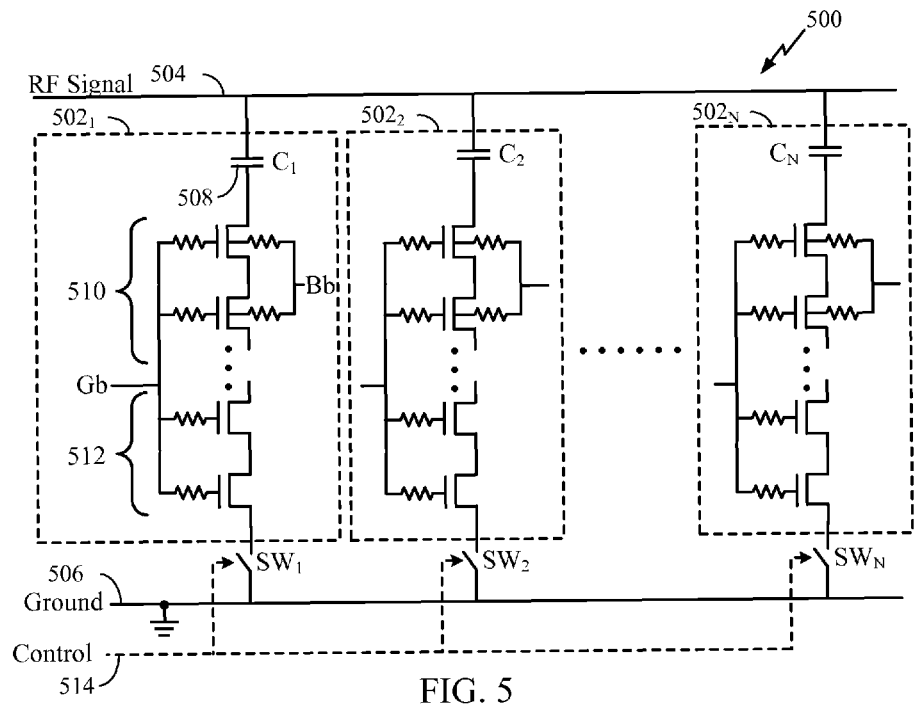
FIG. 5 shows an exemplary embodiment of a high power tunable capacitor comprising a plurality of high power switchable capacitor branches.

FIG. 5 shows an exemplary embodiment of a novel high power tunable capacitor 500. The tunable capacitor 500 is suitable for use as the high power tunable capacitor 204 shown in FIG. 2. The capacitor 500 comprises (N) high power switchable capacitor branches 502. The N high power switchable capacitor branches 502 are coupled between an RF signal input 504 and ground 506 through N corresponding switches (SW). As illustrated by switch branch $502_1$, each branch comprises a fixed capacitor 508, a first switch group 510, and a second switch group 512. The first switch group 510 comprises body contacted switches, and the second switch group 512 comprises non body contacted (or floating body) switches. The switches in the second switch group 512 have no body terminal and do not receive a body bias (Bb) signal.

It should be noted that the first switch group 510 and the second switch group 512 may included any number of switches. During operation, the second switch group 512 operates to decouple the body bias (Bb) signal from the ground thereby maintaining a stable body bias (Bb) signal and improving capacitor performance over conventional tunable capacitors.

The high power switchable capacitor branches 502 are selectively coupled to ground by switches $SW_1$-$SW_N$. As illustrated in FIG. 5, there are N high power switchable capacitor branches 502 that are selectively coupled to ground by the N switches (SW). In an exemplary embodiment, a controller (not shown), such as a baseband processor, operates to generate a switch control signal 514 to open and close the switches (SW) to enable and disable selected branches 502 so as to determine the amount of capacitance provided by the tunable capacitor 500. For example, the total capacitance can be determined from the parallel combination of the capacitance of the enabled branches 502. Thus, a single branch may be enabled to provide the capacitance associated with that branch, or a plurality of branches may be enabled to provide a capacitance equal to the capacitance associated with the total number of enabled branches.

Figure 6:
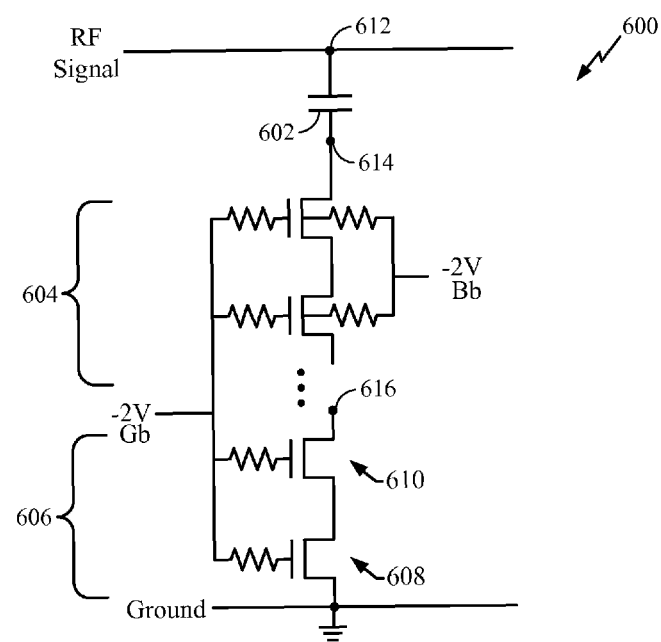
FIG. 6 shows an exemplary embodiment of a high power switchable capacitor branch.

FIG. 6 shows an exemplary embodiment of a high power switchable capacitor branch 600. For example, the switchable capacitor branch 600 is suitable for use as any of the high power switchable capacitor branches 502 used in the high power tunable capacitor 500 shown in FIG. 5. The switchable capacitor branch 600 comprises a fixed capacitor 602 and a switch arrangement that includes a first switch group 604 comprising one or more body contacted FET switches, and a second switch group 606 comprising one or more non body contacted (or floating body) FET switches. For example, the second switch group 606 comprises FET switches 608, 610 that are configured as floating body switches (i.e., the body is floating and not connected to any body bias signal). It will be assumed that a switch to ground associated with the switchable capacitor branch 600 is closed.

The capacitor 602 has a first terminal 612 connected to receive an RF input signal to be filtered. The capacitor 602 has a second terminal 614 that outputs a filtered input signal. The filtered input signal at the terminal 614 is input to the first switch group 604, which switches the filtered input signal to generate a switched filtered input signal at terminal 616. The first switch group 604 utilizes the body bias (Bb) connected to their body terminals to switch the filtered input signal at terminal 614 to generate the switched filtered input signal at terminal 616. The first switch group 604 utilizes the gate bias (Gb) to bias their gate terminals. In an exemplary embodiment, only one body contacted switch is utilized in the first switch group 604. In other exemplary embodiments, multiple body contacted switches are utilized in the first switch group 604.

The second switch group 606 comprises one or more floating body switches that receive the switched filtered input signal at terminal 616 and switch this signal to ground to complete the circuit. The floating body switches in the second switch group 606 have gate terminals coupled to receive the gate bias (Gb) signal. The floating body switches in the second switch group 606 have floating bodies and so are not coupled to the body bias (Bb) signal. In one exemplary embodiment, only one floating body switch is utilized in the second switch group 606. In other exemplary embodiments, multiple floating body switches are utilized in the second switch group 606.

During operation, the floating body switches in the second switch group 606 operate to decouple the negative body bias (Bb) supply (−2V) from noise on the RF ground. For example, noise on the RF ground does not turn on the internal junction diodes of the floating body switches in the second switch group 606. As a result, the performance of the tunable capacitor 500 is improved over conventional tunable capacitors. Since switches 608, 610 handle a very small portion of the strong main RF signal being switched, implementing the switches 608, 610 as floating body FET switches does not significantly affect overall linearity performance of the tunable capacitor 500.

Therefore, in various exemplary embodiments, a novel high power tunable capacitor is provided that comprises a plurality of switchable capacitor branches 502. Each branch comprises a novel switch arrangement having a first switch group 604 of body contacted switches connected to a second switch group 606 comprising at least one floating body switch. The floating body switch is configured so that noise on the RF ground is decoupled from the negative body bias (Bb) supply signal utilized by the first switch group 604 thereby providing improved performance over conventional tunable capacitors that utilize all body contacted switches. The novel switch arrangement also provides substantially the same power capacity and linearity as conventional circuits.

Figure 7:
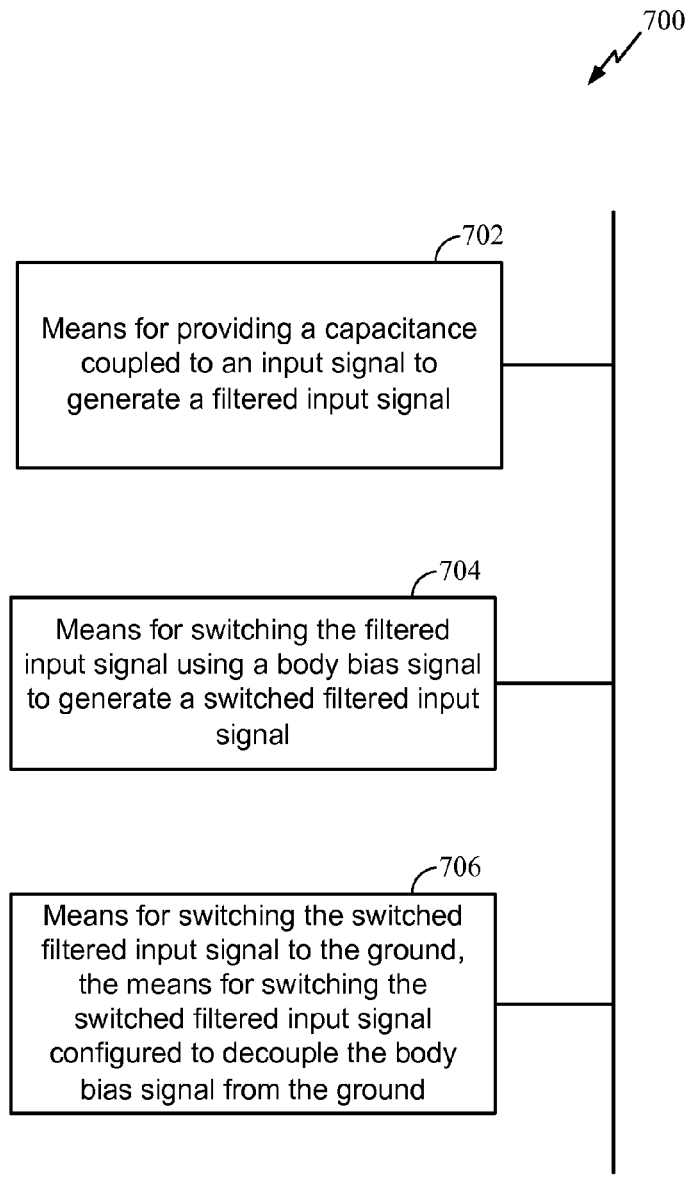
FIG. 7 shows an exemplary embodiment of a high power tunable capacitor apparatus.

FIG. 7 shows an exemplary embodiment of a high power tunable capacitor apparatus 700. For example, the apparatus 700 is suitable for use as the capacitor 106 shown in FIG. 1. In an aspect, the apparatus 700 is implemented by one or more modules configured to provide the functions as described herein. For example, in an aspect, each module comprises hardware and/or hardware executing software.

The apparatus 700 comprises a first module comprising means (702) for providing a capacitance coupled to an input signal to generate a filtered input signal, which in an aspect comprises the fixed capacitor 602.

The apparatus 700 also comprises a second module comprising means (704) for switching the filtered input signal using a body bias signal to generate a switched filtered input signal, which in an aspect comprises the body contacted switches in the first switch group 604.

The apparatus 700 also comprises a third module comprising means (706) for switching the switched filtered input signal to the ground, the means for switching the switched filtered signal configured to decouple the body bias signal from the ground, which in an aspect comprises the floating body switches in the second switch group 606.

Those of skill in the art would understand that information and signals may be represented or processed using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. It is further noted that transistor types and technologies may be substituted, rearranged or otherwise modified to achieve the same results. For example, circuits shown utilizing PMOS transistors may be modified to use NMOS transistors and vice versa. Thus, the amplifiers disclosed herein may be realized using a variety of transistor types and technologies and are not limited to those transistor types and technologies illustrated in the Drawings. For example, transistors types such as BJT, GaAs, MOSFET or any other transistor technology may be used.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the exemplary embodiments of the invention.

The various illustrative logical blocks, modules, and circuits described in connection with the embodiments disclosed herein may be implemented or performed with a general purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in Random Access Memory (RAM), flash memory, Read Only Memory (ROM), Electrically Programmable ROM (EPROM), Electrically Erasable Programmable ROM (EEPROM), registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both non-transitory computer storage media and communication media including any medium that facilitates transfer of a computer program from one place to another. A non-transitory storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and Blu-ray disc where disks usually reproduce data magnetically, while discs reproduce data optically with lasers. Combinations of the above should also be included within the scope of computer-readable media.

The description of the disclosed exemplary embodiments is provided to enable any person skilled in the art to make or use the invention. Various modifications to these exemplary embodiments will be readily apparent to those skilled in the art, and the generic principles defined herein may be applied to other embodiments without departing from the spirit or scope of the invention. Thus, the invention is not intended to be limited to the exemplary embodiments shown herein but is to be accorded the widest scope consistent with the principles and novel features disclosed herein.

What is claimed is:

1. An apparatus comprising:
a capacitor coupled to an input signal;
a body contacted switch coupled to the capacitor, the body contacted switch coupled to a body bias signal; and
a floating body switch coupled between the body contacted switch and a ground, the floating body switch configured to decouple the body bias signal from the ground.

2. The apparatus of claim 1, the body contacted switch comprising a body contacted FET switch.

3. The apparatus of claim 1, the floating body switch comprising a floating body FET switch.

4. The apparatus of claim 1, the body bias signal comprising a negative bias supply.

5. The apparatus of claim 4, the floating body switch configured to decouple the negative bias supply from noise on the ground.

6. The apparatus of claim 1, the capacitor, body contacted switch and floating body switch forming a switchable capacitor branch, the apparatus further comprising a plurality of the switchable capacitor branches that are configured to generate a variable capacitance.

7. The apparatus of claim 6, further comprising a plurality of switch control signals connected to the plurality of the switchable capacitor branches, respectively, the plurality of switch control signals configured to enable one or more of the switchable capacitor branches to form the variable capacitance having a value determined by a number of enabled branches.

8. The apparatus of claim 1, the capacitor having a first terminal and a second terminal, the first terminal coupled to the input signal.

9. The apparatus of claim 8, the body contacted switch coupled to the second terminal, the body contacted switch comprising a body contacted terminal coupled to the body bias signal.

10. The apparatus of claim 8, the capacitor generating a filtered input signal at the second terminal.

11. The apparatus of claim 10, the body contacted switch configured to receive the filtered input signal and generate a switched filtered signal.

12. The apparatus of claim 10, the floating body switch configured to selectively couple the switch filtered signal to the ground.

13. An apparatus comprising:
means for providing a capacitance coupled to an input signal to generate a filtered input signal;
means for switching the filtered input signal using a body bias signal to generate a switched filtered input signal; and
means for switching the switched filtered input signal to the ground, the means for switching the switched filtered input signal configured to decouple the body bias signal from the ground.

14. The apparatus of claim 13, the means for switching the filtered input signal comprising one or more body contacted FET switches comprising gate terminals connected to a gate bias signal and body contacted terminals connected to the body bias signal.

15. The apparatus of claim 13, the means for switching the switched filtered input signal comprising one or more floating body FET switches.

16. The apparatus of claim 13, the body bias signal comprising a negative bias supply.

17. The apparatus of claim 16, the means for switching the switched filtered input signal configured to decouple the negative bias supply from noise on the ground.

18. The apparatus of claim 13, the means for providing the capacitance, the means for switching the filtered input signal, and the means for switching the switched filtered input signal forming a means for switching a capacitance, the apparatus further comprising a plurality of the means for switching the capacitance that are configured to generate a variable capacitance.

19. The apparatus of claim 18, further comprising means for enabling the plurality of the means for switching the capacitance, the means for enabling configured to determine a capacitance value for the variable capacitance from a total number of the means for switching the capacitance that are enabled.

* * * * *